(12) United States Patent
Tetelbaum (10) Patent No.: US 7,015,569 B1
(45) Date of Patent: Mar. 21, 2006

(54) METHOD AND APPARATUS FOR IMPLEMENTING A CO-AXIAL WIRE IN A SEMICONDUCTOR CHIP

(75) Inventor: Alexander Tetelbaum, Hayward, CA (US)

(73) Assignee: LSI Logic Corporation, Milpitas, CA (US)

( * ) Notice: Subject to any disclaimer, the term of this patent is extended or adjusted under 35 U.S.C. 154(b) by 48 days.

(21) Appl. No.: 10/927,985

(22) Filed: Aug. 26, 2004

(51) Int. Cl.
*H01L 23/552* (2006.01)

(52) U.S. Cl. .................... 257/659; 257/660; 257/662; 257/664; 438/731

(58) Field of Classification Search ............... 257/659, 257/660, 662, 664; 438/731
See application file for complete search history.

(56) References Cited

U.S. PATENT DOCUMENTS

| | | | |
|---|---|---|---|
| 4,514,749 A | | 4/1985 | Shoji |
| 5,109,168 A | | 4/1992 | Rusu |
| 5,338,897 A | * | 8/1994 | Tsay et al. ................. 174/35 R |
| 6,456,117 B1 | | 9/2002 | Tanaka |
| 2002/0075104 A1 | * | 6/2002 | Kwon et al. ................. 333/238 |

\* cited by examiner

*Primary Examiner*—Thien F. Tran
(74) *Attorney, Agent, or Firm*—Fitch, Even, Tabin & Flannery (57) ABSTRACT

A coaxial shield for a semiconductor chip includes: a top vertical shield wire formed in a top metal layer of a semiconductor chip wherein the top vertical shield wire has a selected length for providing a coaxial shield; a first side shield wire formed in an intermediate metal layer of the semiconductor chip; a first upper via formed in a first dielectric layer of the semiconductor chip that extends lengthwise parallel to the first side shield wire to electrically connect the first side shield wire to the top vertical shield wire along the selected length; a second side shield wire formed in the intermediate metal layer of the semiconductor chip having a length corresponding to the selected length wherein the second side shield wire extends lengthwise parallel to the first side shield wire; and a second upper via formed in the first dielectric layer that extends lengthwise parallel to the second side shield wire to electrically connect the second side shield wire to the top vertical shield wire along the length corresponding to the selected length.

16 Claims, 12 Drawing Sheets

1118
Shielding wire in
metal layer m-1

FIG._13

Vias between metal layers m and m-1

FIG._14

Shielding wires in metal layer m

FIG._15

Vias between metal layers m and m+1

METHOD AND APPARATUS FOR IMPLEMENTING A CO-AXIAL WIRE IN A SEMICONDUCTOR CHIP

BACKGROUND OF THE INVENTION

1. Field of the Invention

The present invention is directed to the manufacture of integrated circuits. More specifically, but without limitation thereto, the present invention is directed to shielding conductors in semiconductor chips.

2. Description of Related Art

Crosstalk noise is generally capacitively and inductively coupled between traces in an integrated circuit and is most significant when the sources of the crosstalk, commonly referred to as aggressor nets or aggressors, have a fast switching waveform. The switching waveforms of one or more aggressor nets are coupled by parasitic capacitance and inductance to a "victim" net. The crosstalk noise may cause false switching in the victim net (noise violation) or alter the net delay, resulting in failure of the integrated circuit design to meet timing specifications.

SUMMARY OF THE INVENTION

In one aspect of the present invention, a coaxial shield for a semiconductor chip includes:
  a top vertical shield wire formed in a top metal layer of a semiconductor chip wherein the top vertical shield wire has a selected length for providing a coaxial shield;
  a first side shield wire formed in an intermediate metal layer of the semiconductor chip;
  a first upper via formed in a first dielectric layer of the semiconductor chip that extends lengthwise parallel to the first side shield wire to connect the first side shield wire to the top shield wire along the selected length;
  a second side shield wire formed opposite the first side shield wire in the intermediate metal layer of the semiconductor chip having a length corresponding to the selected length wherein the second side shield wire extends lengthwise parallel to the first side shield wire; and
  a second upper via formed in the first dielectric layer that extends lengthwise parallel to the second side shield wire to electrically connect the second side shield wire to the top shield wire along the length corresponding to the selected length.

In another aspect of the present invention, A method of shielding a volume in a semiconductor chip includes steps of:
  forming a top shield wire in a top metal layer of a semiconductor chip wherein the top shield wire has a selected length for providing a coaxial shield;
  forming a first side shield wire in an intermediate metal layer of the semiconductor chip;
  forming a first upper via in a first dielectric layer of the semiconductor chip that extends lengthwise parallel to the first side shield wire to electrically connect the first side shield wire to the top shield wire along the selected length;
  forming a second side shield wire opposite the first side shield wire in the intermediate metal layer of the semiconductor chip having a length corresponding to the selected length wherein the second side shield wire extends lengthwise parallel to the first side shield wire; and
  forming a second upper via in the first dielectric layer that extends lengthwise parallel to the second side shield wire to electrically connect the second side shield wire to the top shield wire along the length corresponding to the selected length.

BRIEF DESCRIPTION OF THE DRAWINGS

The present invention is illustrated by way of example and not limitation in the accompanying figures, in which like references indicate similar elements throughout the several views of the drawings, and in which.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

One of the most significant factors that may affect propagation delay in a net of an integrated circuit design is the crosstalk noise generated from signals carried in wires adjacent to the net. The crosstalk noise may inject an incremental crosstalk delay (positive or negative) in a net. Crosstalk noise is generally coupled by parasitic capacitance and inductance between traces or wires in an integrated circuit die and is most significant when the sources of the crosstalk, commonly referred to as aggressor nets, or "aggressors", have a fast switching waveform. The switching waveforms of one or more aggressor nets are coupled by parasitic coupling capacitance and inductance to a net commonly referred to as a victim net or "victim". Crosstalk noise may cause false switching in the victim net or alter the value of net delay, resulting in consequent failure of the integrated circuit design to meet setup time, hold time, or other timing specifications.

Examples of previous methods for avoiding crosstalk in integrated circuit designs are described, for example, on U.S. Pat. No. 5,109,168 issued on Apr. 28, 1992 to Rusu (Rusu), U.S. Pat. No. 4,514,749 issued on Apr. 30, 1985 to Shoji (Shoji), and U.S. Pat. No. 6,456,117 issued on Sep. 24, 2002 to Tanaka (Tanaka), all of which are incorporated herein by reference. Rusu Shoji, and Tanaka disclose increasing the wire spacing around critical nets and routing shield wires adjacent to wires in the same metal layer of a critical net, also referred to as coplanar routing. Disadvantageously, neither of these methods provide full protection from crosstalk noise. Increasing the spacing around critical nets may result in a larger die area, which increases manufacturing costs and may also impact other design criteria.

An integrated circuit design is typically implemented by a semiconductor die, or chip, that includes a number of parallel, electrically conductive metal layers in which the wires that connect the nets are formed. The metal layers are generally electrically insulated from one another by insulating layers of dielectric material. Electrical connections from one metal layer to another are made by electrically conductive vias formed in the insulating layers of dielectric material.

Figure 1:
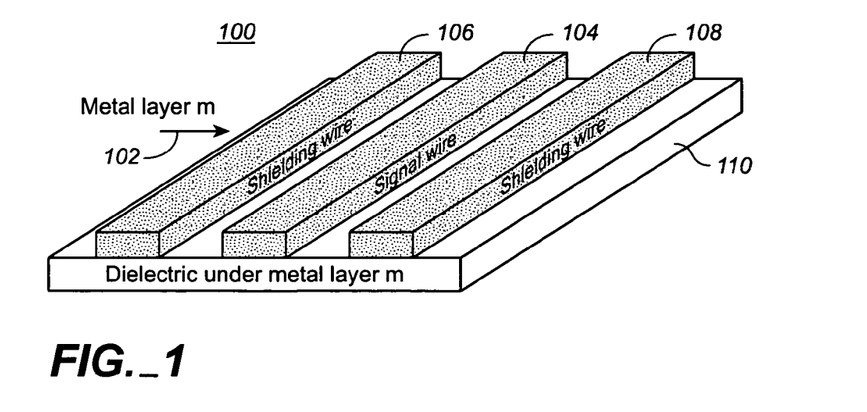
FIG. 1 illustrates a perspective view of crosstalk shielding using coplanar routing in a semiconductor die according to the prior art.

FIG. 1 illustrates a perspective view 100 of crosstalk shielding using coplanar routing in a semiconductor die according to the prior art. Shown in FIG. 1 are a metal layer 102, a signal wire 104, side shield wires 106 and 108, and a dielectric layer 110.

In FIG. 1, the side shield wires 106 and 108 are routed parallel to the signal wire 104 in the same metal layer 102 and are typically connected to ground. Alternatively, the side shield wires 106 and 108 may be driven by a signal to reduce capacitive coupling as described in Tanaka. However, crosstalk noise may still be coupled into the signal wire 104 as illustrated in FIG. 2.

Figure 2:
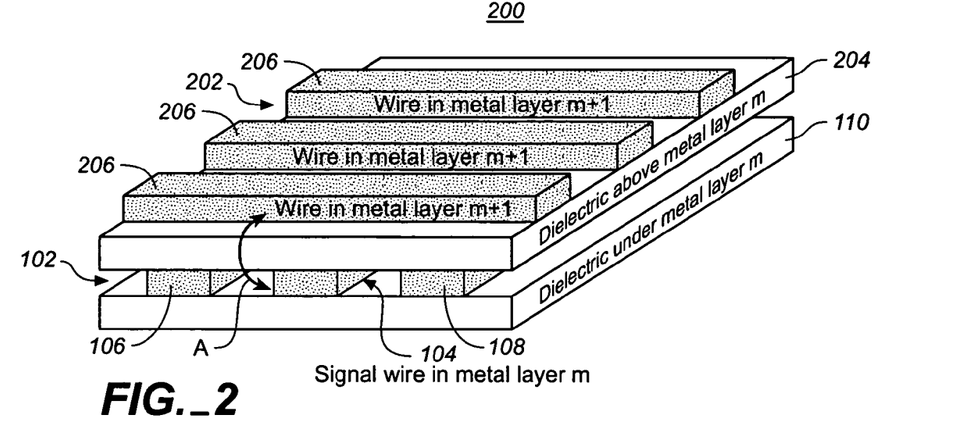
FIG. 2 illustrates a perspective view of crosstalk noise coupling from another metal layer using the crosstalk shielding method of FIG. 1.

FIG. 2 illustrates a perspective view of crosstalk noise coupling from another metal layer 200 using the crosstalk shielding method 100 of FIG. 1. Shown in FIG. 2 are metal layers 102 and 202, a signal wire 104, side shield wires 106 and 108, dielectric layers 110 and 204, and crosstalk signal wires 206.

In FIG. 2, crosstalk noise is coupled into the signal wire 104 from one or more of the crosstalk signal wires 206 in another metal layer 202 as shown by the arrow at A. Also, crosstalk noise may be coupled into the signal wire 104 from the same metal layer 102 as shown in FIG. 3.

Figure 3:
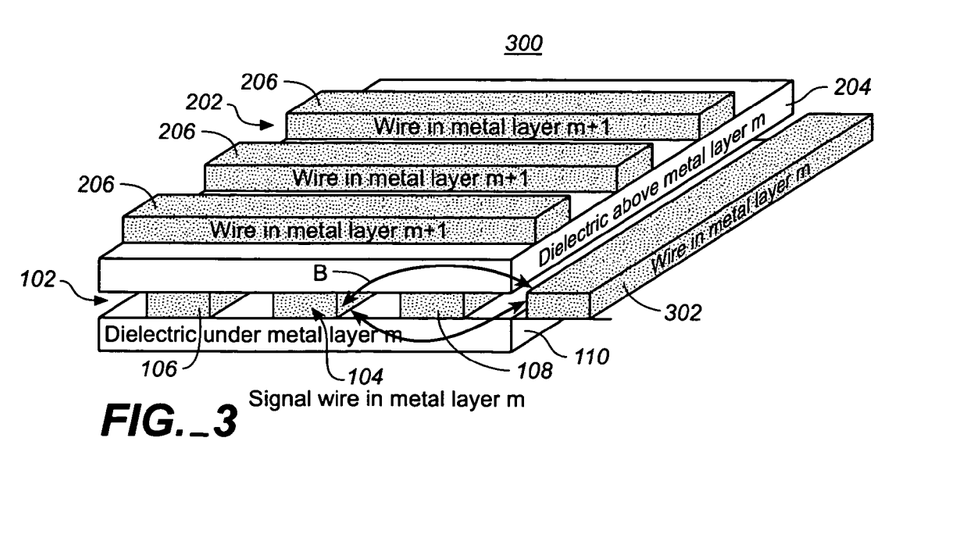
FIG. 3 illustrates a perspective view of crosstalk noise coupling from the same metal layer using the crosstalk shielding method of FIG. 1.

FIG. 3 illustrates a perspective view of crosstalk noise coupling 300 from the same metal layer using the crosstalk shielding method 100 of FIG. 1. Shown in FIG. 3 are metal layers 102 and 202, a signal wire 104, side shield wires 106 and 108, dielectric layers 110 and 204, and crosstalk signal wires 206 and 302.

In FIG. 3, crosstalk noise is coupled into the signal wire 104 in the same metal layer 102 from the crosstalk signal wire 302 as shown by the arrow at B. Cross noise coupling due to coupling capacitance may be worse if wires are routed in non-preferred directions as illustrated in FIG. 4.

Figure 4:
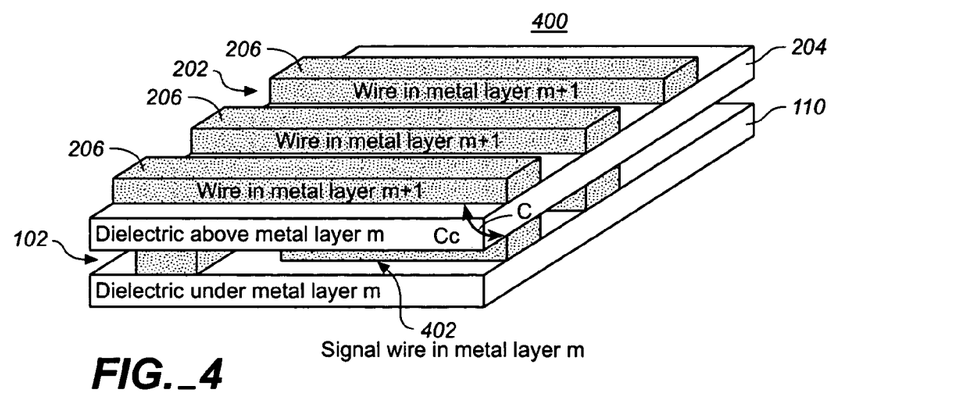
FIG. 4 illustrates a perspective view of crosstalk noise coupling in a wire segment routed in a non-preferred direction according to the prior art.

FIG. 4 illustrates a perspective view of crosstalk noise coupling in a wire segment routed in a non-preferred direction 400 according to the prior art. Shown in FIG. 4 are metal layers 102 and 202, a signal wire 402, dielectric layers 110 and 204, and crosstalk signal wires 206.

In FIG. 4, the signal wire 402 is routed in the metal layer 102 parallel to the crosstalk signal wires 206 in the next metal layer 202. Typically, wires are routed in a single preferred direction in each metal layer, and the preferred direction alternates between horizontal in one metal layer and vertical in the next metal layer. If a wire segment is routed in a non-preferred direction as in the example of the signal wire 402 in the metal layer 202, then the coupling capacitance with respect to the crosstalk signal wires 206 in the next metal layer 202 is increased, as shown by the arrow at C. Increasing the spacing around the wire segment 402 or routing side shield wires coplanar with the wire segment 402 will not protect the wire segment 402 from crosstalk noise in this situation, possibly resulting in a non-routable floor plan.

Figure 5:
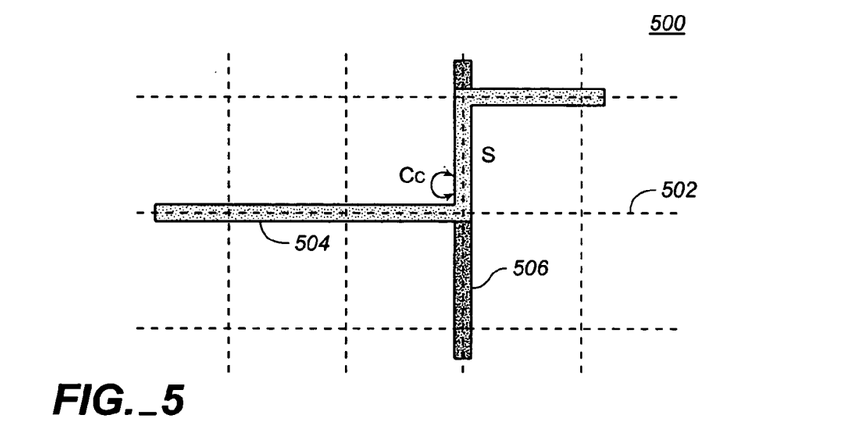
FIG. 5 illustrates a top view of coupling capacitance resulting from a wire segment routed in a non-preferred direction according to the prior art.

FIG. 5 illustrates a top view of coupling capacitance resulting from a wire segment routed in a non-preferred direction 500 according to the prior art. Shown in FIG. 5 are a routing grid 502, a signal wire 504, and a crosstalk signal wire 506.

In FIG. 5, a portion of the signal wire 504 is routed in a non-preferred direction in the metal layer adjacent to the metal layer of the crosstalk signal wire 506. As a result, the coupling capacitance between the signal wire 504 and the crosstalk signal wire 506 is significantly increased, increasing the crosstalk noise coupled into the signal wire 504 as shown by the arrow at C.

Figure 6:
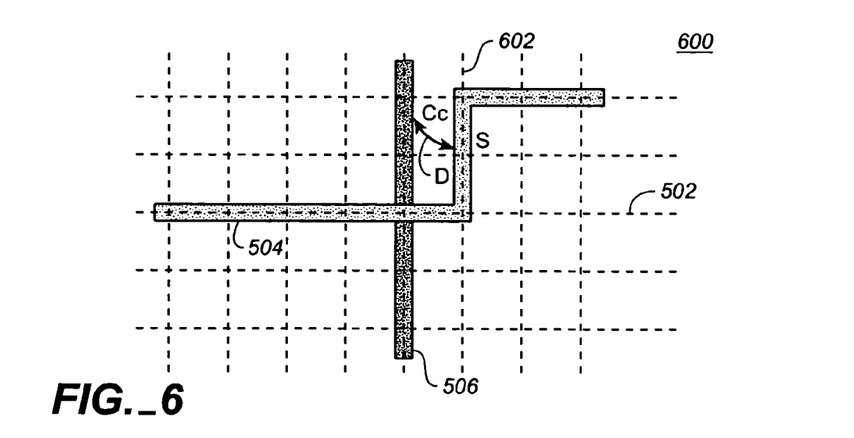
FIG. 6 illustrates a top view of a shifted routing grid for reducing the coupling capacitance in the arrangement of FIG. 5.

FIG. 6 illustrates a top view of a shifted routing grid 600 for reducing the coupling capacitance in the arrangement of FIG. 5. Shown in FIG. 6 are a routing grid 502, a signal wire 504, a crosstalk signal wire 506, and a shifted routing grid 602.

In FIG. 6, the signal wire 504 is routed along the routing grid 502 in one metal layer, and the crosstalk signal wire 506 is routed along the routing grid 602 in the next metal layer. The routing grid 602 in the next metal layer is shifted by one-half the grid spacing, so that the coupling capacitance between the signal wire 504 and the crosstalk signal wire 506 is significantly decreased, substantially reducing the crosstalk noise coupled into the signal wire 504 as shown by the arrow at D.

Figure 7:
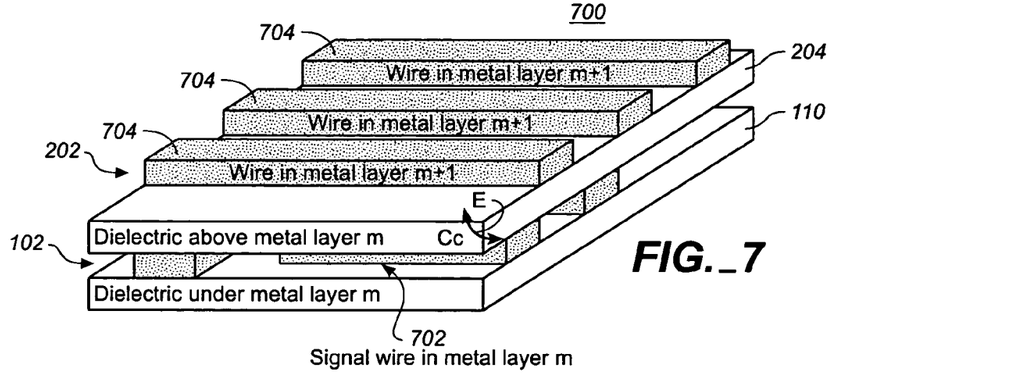
FIG. 7 illustrates a perspective view of the crosstalk protection method of FIG. 6.

FIG. 7 illustrates a perspective view 700 of the crosstalk protection method of FIG. 6. Shown in FIG. 7 are metal layers 102 and 202, dielectric layers 110 and 204, a signal wire 702, and crosstalk signal wires 704.

In FIG. 7, the crosstalk signal wires 704 in the metal layer 202 are routed in a routing grid that is shifted by one-half the grid spacing of the routing grid in the metal layer 102 and the signal wire 702 so that the coupling capacitance is reduced as shown by the arrow at E.

Figure 8:
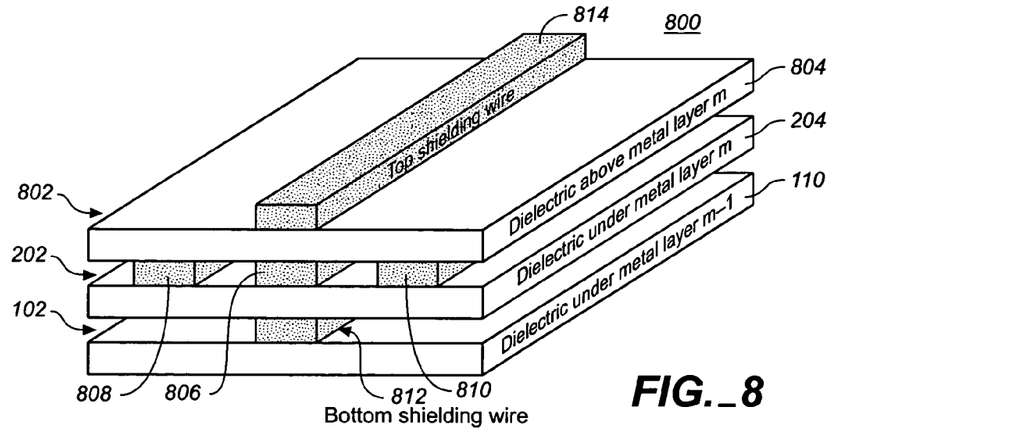
FIG. 8 illustrates a perspective view of combined coplanar and vertical parallel routing for crosstalk protection according to the prior art.

FIG. 8 illustrates a perspective view of combined coplanar and vertical parallel routing for crosstalk protection 800 according to the prior art. Shown in FIG. 8 are metal layers 102, 202 and 802, dielectric layers 110, 204 and 804, a signal wire 806, side shield wires 808 and 810, and vertical shield wires 812 and 814.

In FIG. 8, the signal wire 806 is surrounded in three dimensions by the side shield wires 808 and 810 in the same metal layer 202, by the vertical shield wire 812 in the metal layer 102, and by the vertical shield wire 814 in the metal layer 802. The side shield wires 808 and 810 and vertical shield wires 812 and 814 are routed parallel to the signal wire 806 to minimize parasitic coupling capacitance and inductance between the signal wire 806 and crosstalk signal wires. However, crosstalk signals may still be coupled into the signal wire 806 as illustrated in FIG. 9.

Figure 9:
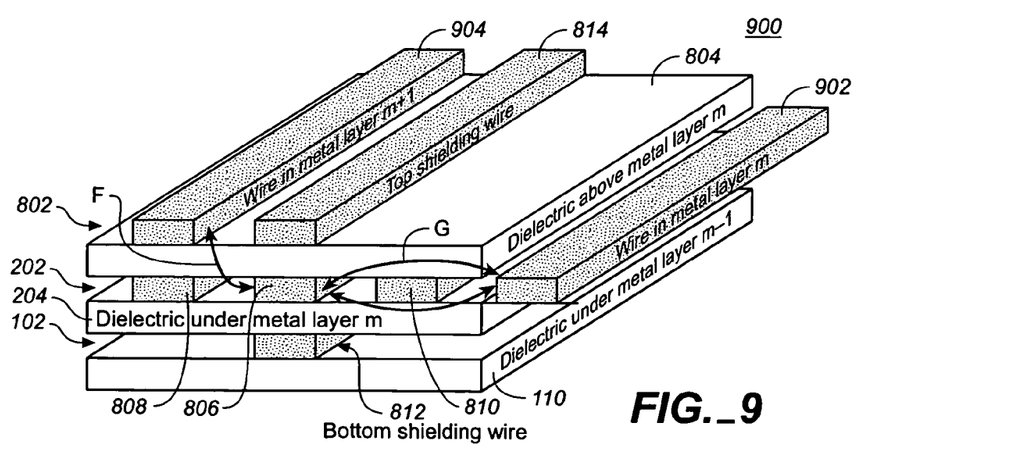
FIG. 9 illustrates a perspective view of crosstalk coupling in the crosstalk protection scheme of FIG. 8.

FIG. 9 illustrates a perspective view of crosstalk coupling 900 in the crosstalk protection scheme of FIG. 8. Shown in FIG. 9 are metal layers 102, 202 and 802, dielectric layers 110, 204 and 804, a signal wire 806, side shield wires 808 and 810, vertical shield wires 812 and 814, and crosstalk signal wires 902 and 904.

In FIG. 9, crosstalk noise may be coupled from the crosstalk signal wires 902 and 904 into the signal wire 806 as shown by the arrows at F and G.

Figure 10:
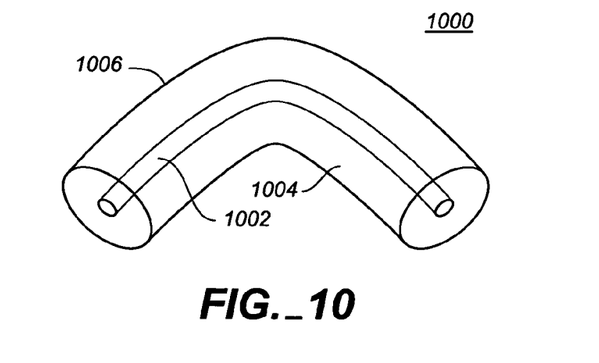
FIG. 10 illustrates a perspective view of a coaxial cable according to the prior art.

In circuits made from separate components, that is, not sharing the same substrate and package, critical signal wires are typically protected by a coaxial cable as shown in FIG. 10.

FIG. 10 illustrates a perspective view of a coaxial cable 1000 according to the prior art. Shown in FIG. 10 is a center conductor 1002, a dielectric spacer 1004, and a shield 1006.

In FIG. 10, the center conductor is electrically surrounded by the shield 1006. The shield 1006 is typically made of braided copper wire and is spaced apart from the center conductor 1002 by the dielectric spacer 1004 to provide a uniform distribution of capacitance and inductance along the coaxial cable 1000. The coaxial cable 1000 provides superior crosstalk protection for larger scale circuits, however, the construction of the coaxial cable in FIG. 10 is not practical in a semiconductor chip.

In one aspect of the present invention, a coaxial shield for a semiconductor chip includes:

a top vertical shield wire formed in a top metal layer of a semiconductor chip wherein the top vertical shield wire has a selected length for providing a coaxial shield;

a first side shield wire formed in an intermediate metal layer of the semiconductor chip;

a first upper via formed in a first dielectric layer of the semiconductor chip that extends lengthwise parallel to the first side shield wire to electrically connect the first side shield wire to the top vertical shield wire along the selected length;

a second side shield wire formed opposite the first shield wire in the intermediate metal layer of the semiconductor chip having a length corresponding to the selected length wherein the second side shield wire extends lengthwise parallel to the first side shield wire; and a second upper via formed in the first dielectric layer that extends lengthwise parallel to the second side shield wire to electrically connect the second side shield wire to the top vertical shield wire along the length corresponding to the selected length.

Figure 11:
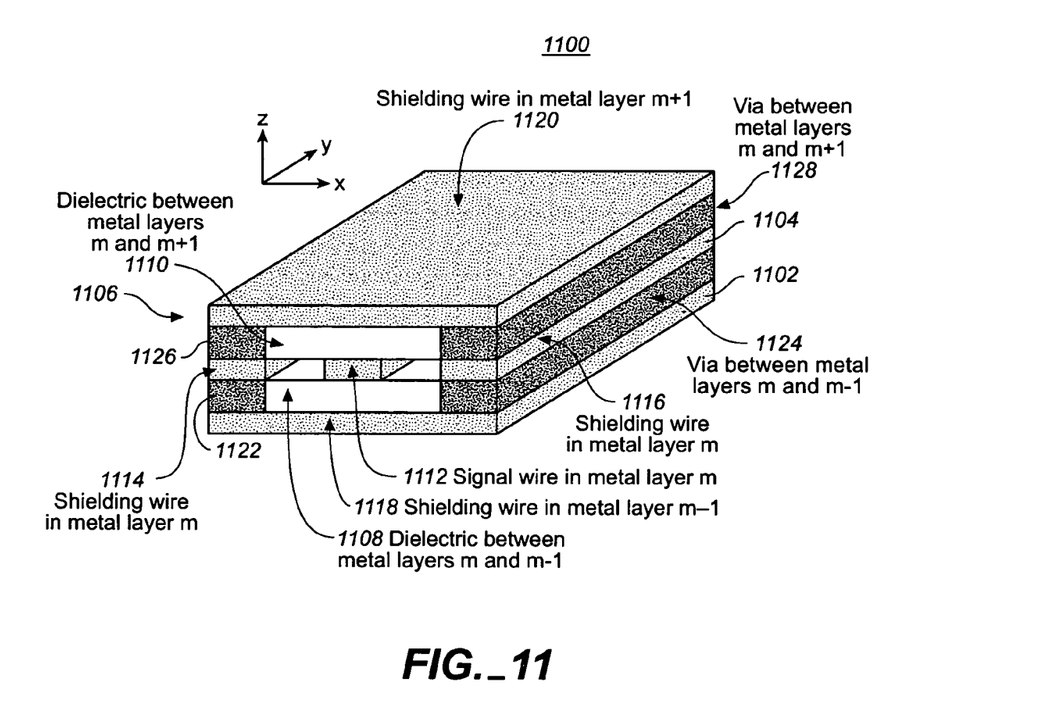
FIG. 11 illustrates a perspective view of a coaxial shield for a critical signal wire according to an embodiment of the present invention.

FIG. 11 illustrates a perspective view of a coaxial shield 1100 for a critical signal wire according to an embodiment of the present invention. Shown in FIG. 11 are metal layers 1102, 1104 and 1106, dielectric layers 1108 and 1110, a signal wire 1112, side shield wires 1114 and 1116, vertical shield wires 1118 and 1120, and vias 1122, 1124, 1126 and 1128.

The vertical shield wires 1118 and 1120 are formed as wide traces according to well known techniques. The vertical shield wires 1118 and 1120 have a selected length for providing a coaxial shield, in this example, to the signal wire 1112.

The side shield wires 1114 and 1116 may be formed, for example, on opposite sides of the signal wire 1112 in the same manner as in FIG. 1 of the prior art. The vertical shield wires 1118 and 1120 preferably have a trace width that extends to the outside of the side shield wires 1114 and 1116 as shown in FIG. 11.

The vias 1122, 1124, 1126 and 1128 may be formed in the dielectric layers 1108 and 1110, for example, in the same manner used for making vias in a typical semiconductor die. Vias are usually formed as small rectangular holes in a dielectric layer that are filled with an electrically conductive metal, for example, the same material used in the metal layers. The vias electrically connect the two metal layers that are adjacent to the dielectric layer. In various embodiments of the present invention, the small rectangular via shape of the prior art is extended in length and width to form a continuous electrical connection between the metal layers adjacent to the dielectric layer in which the via is formed. The vias 1122 and 1124 formed in the dielectric layer 1108 connect opposite sides of the vertical shield wire 1118 formed in the metal layer 1102 of the semiconductor die to the side shield wires 1114 and 1116 respectively. The vias 1126 and 1128 formed in the dielectric layer 1110 connect opposite sides of the vertical shield wire 1120 formed in the metal layer 1106 of the semiconductor die to the side shield wires 1114 and 1116 respectively.

As shown in FIG. 11, the length and width of the vias 1122, 1124, 1126 and 1128 are preferably equal to the corresponding dimensions of the side shield wires 1114 and 1116. The vias 1122, 1124, 1126 and 1128 electrically connect the side shield wires 1114 and 1116 to the vertical shield wires 1118 and 1120 as shown in FIG. 11, so that the vias 1122, 1124, 1126 and 1128, the side shield wires 1114 and 1116, and the vertical shield wires 1118 and 1120 form a coaxial shield around the signal wire 1112. The coaxial shield around the signal wire 1112 advantageously reduces the parasitic coupling capacitance and inductance from crosstalk signal wires substantially to zero.

Figure 12A:
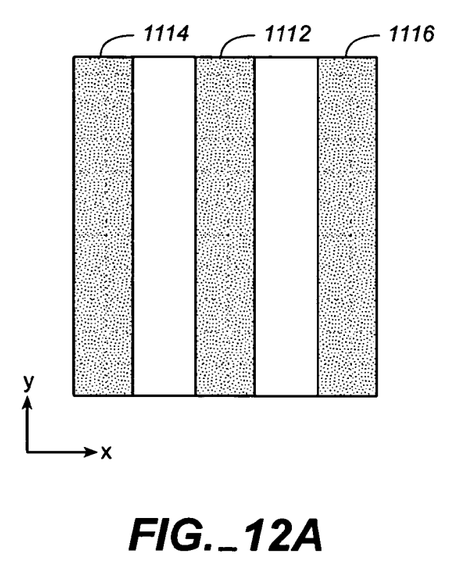
FIGS. 12A, 12B and 12C illustrate section views of the top, side, and front of the coaxial shield of FIG. 11.
Figure 12B:
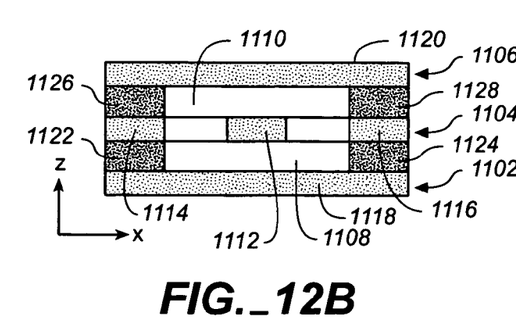
Figure 12C:
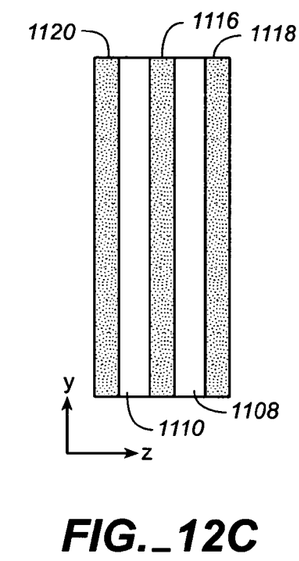

FIGS. 12A, 12B and 12C illustrate section views of the top, side, and front of the coaxial crosstalk protection of FIG. 11. Shown in FIGS. 12A, 12B and 12C are metal layers 1102, 1104 and 1106, dielectric layers 1108 and 1110, a signal wire 1112, side shield wires 1114 and 1116, vertical shield wires 1118 and 1120, and vias 1122, 1124, 1126 and 1128.

Figure 13:
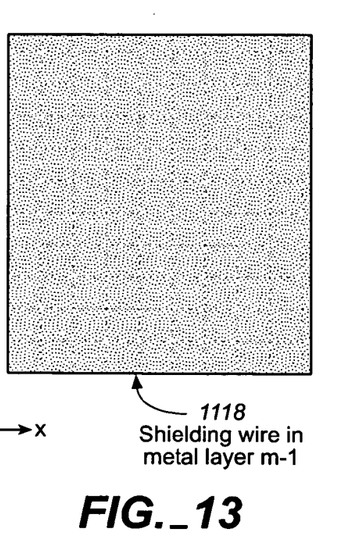
FIG. 13 illustrates a top view of the top vertical shield wire in FIG. 11.

FIG. 13 illustrates a top view of the vertical shield wire 1118 in FIG. 11. The vertical shield wire 1118 are formed, for example, as a wide trace in the metal layer 1102 having a selected length according to well known techniques.

Figure 14:
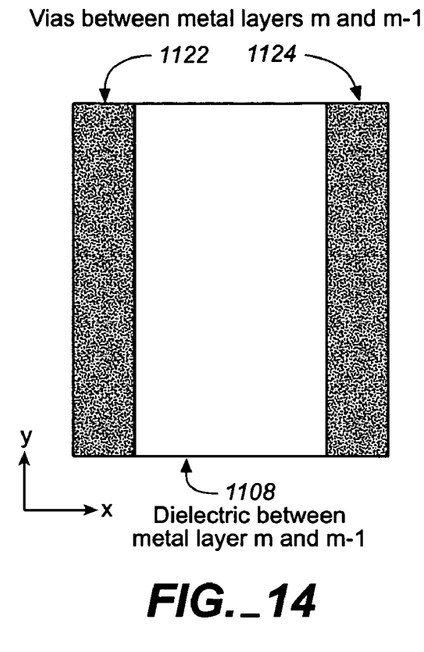
FIG. 14 illustrates a top view of the vias in FIG. 11.

FIG. 14 illustrates a top view of the vias 1122 and 1124 in FIG. 11. The vias 1122 and 1124 of FIG. 11 are formed, for example, in the dielectric layer 1108 according to well known techniques.

Figure 15:
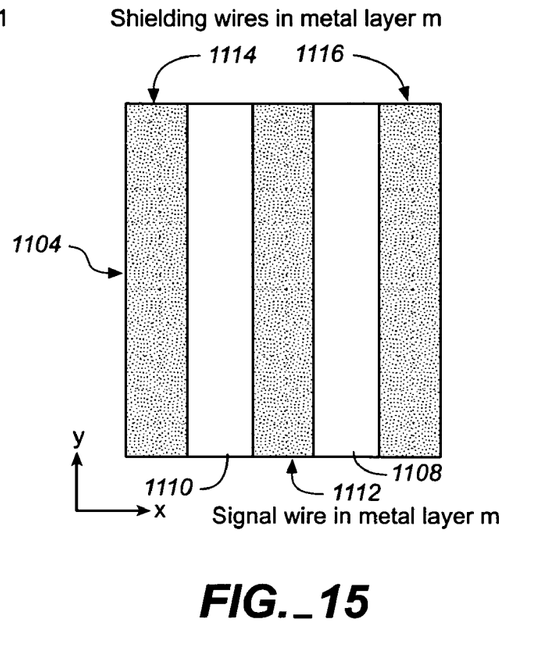
FIG. 15 illustrates a top view of the signal wire and the side shield wires in FIG. 11.

FIG. 15 illustrates a top view of the signal wire 1112 and the side shield wires 1114 and 1116 in FIG. 11. The signal wire 1112 and the side shield wires 1114 and 1116 are formed, for example, according to well known techniques in the metal layer 1104 of FIG. 11. The side shield wires preferably have a length corresponding to the selected length of the vertical shield wires 1118 and 1120 to provide coaxial shielding for the signal wire 1112.

Figure 16:
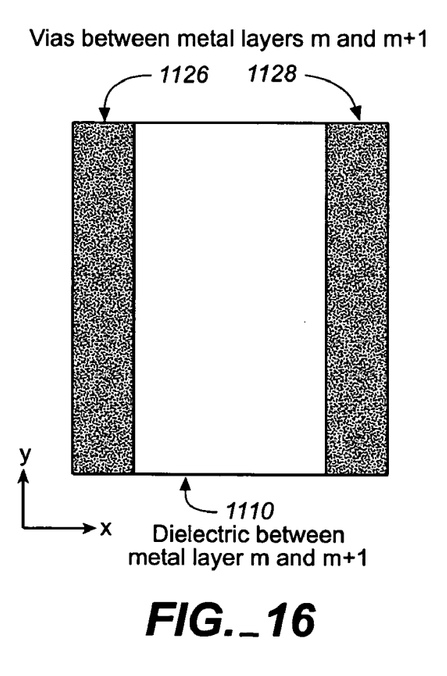
FIG. 16 illustrates a top view of the vias in FIG. 11.

FIG. 16 illustrates a top view of the vias 1126 and 1128 in FIG. 11. The vias 1126 and 1128 are formed in the dielectric layer 1110 according to well known techniques.

Figure 17:
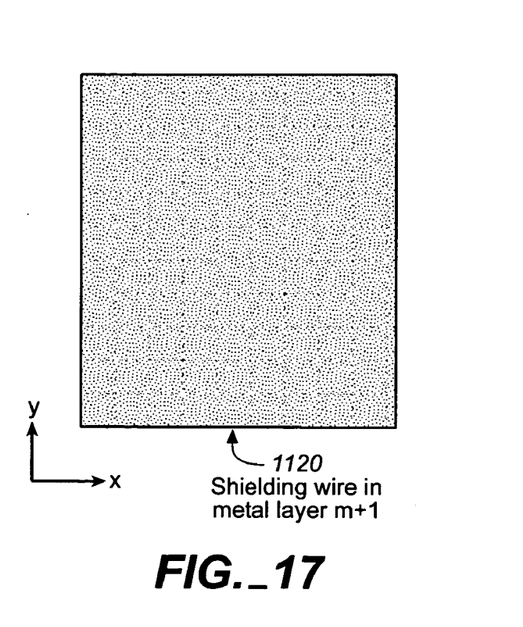
FIG. 17 illustrates a top view of the bottom vertical shield wire in FIG. 11.

FIG. 17 illustrates a top view of the vertical shield wire 1120 in FIG. 11. The vertical shield wire 1120 is formed in the metal layer 1106 as a wide trace according to well known techniques.

In another embodiment of the present invention, the coaxial crosstalk protection scheme of FIG. 11 is extended to a signal wire that changes direction.

Figure 18:
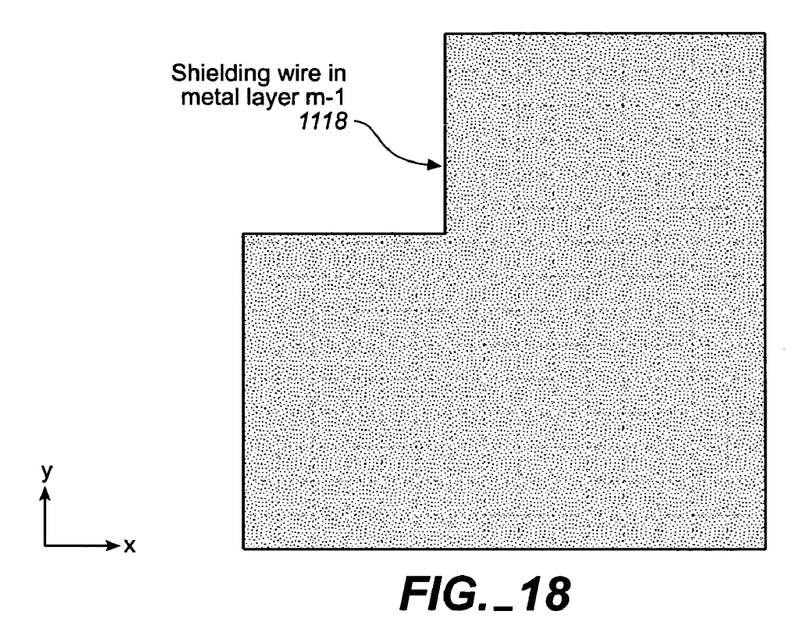
FIG. 18 illustrates a top view of the top vertical shield wire for a signal wire that changes direction according to an embodiment of the present invention.

FIG. 18 illustrates a top view of the vertical shield wire 1118 for a signal wire 1112 that changes direction according to an embodiment of the present invention. The embodiment illustrated in FIG. 18 is the same as that of FIG. 11, except that the vertical shield wires 1118 and 1120, the side shield wires 1114 and 1116, and the vias 1122, 1124, 1126 and 1128 are contoured to follow the changing direction of the signal wire 1112. In the example of FIG. 18, the signal wire 1112 changes direction at a right angle, however, other changes in direction may also be made to practice various embodiments of the present invention within the scope of the appended claims. For example, the signal wire 1118 may change direction along a curve instead of a right angle.

Figure 19:
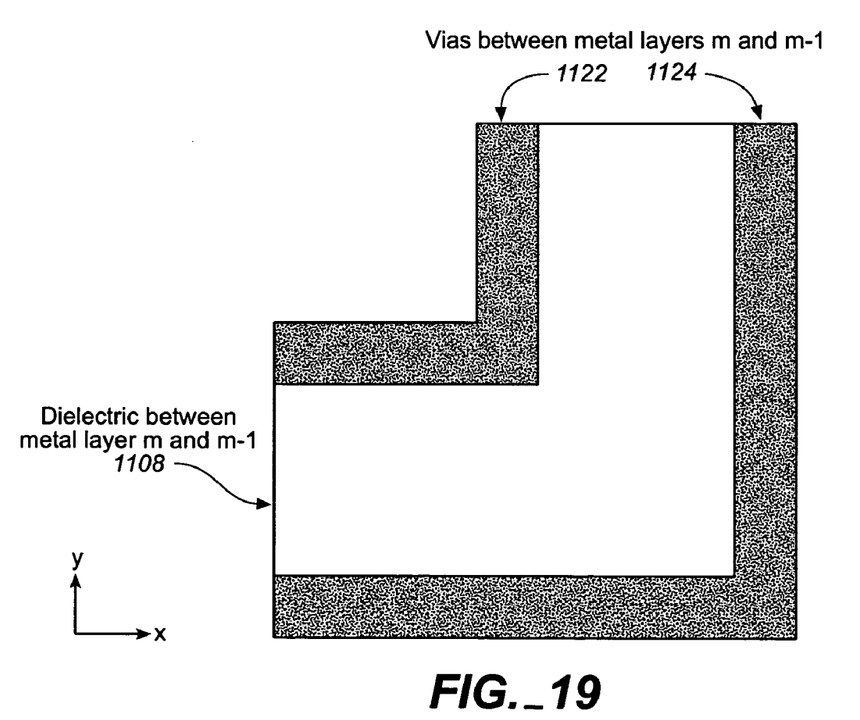
FIG. 19 illustrates a top view of the vias for the embodiment of FIG. 18.

FIG. 19 illustrates a top view of the vias 1122 and 1124 for the embodiment of FIG. 18. The vias 1122 and 1124 are formed in the dielectric layer 1108, for example, according to well known techniques.

Figure 20:
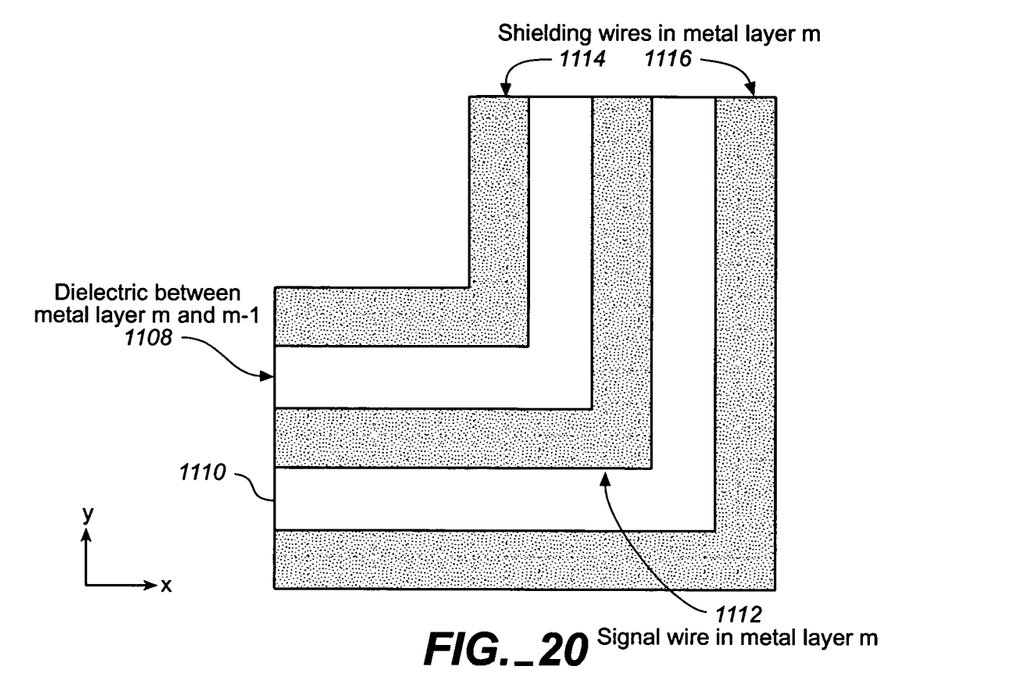
FIG. 20 illustrates a top view of the signal wire and the side shield wires for the embodiment of FIG. 18.

FIG. 20 illustrates a top view of the signal wire 1112 and the side shield wires 1114 and 1116 for the embodiment of FIG. 18. The signal wire 1112 and the side shield wires 1114 and 1116 are formed in the metal layer 1104 according to well known techniques. The side shield wires 1114 and 1116 preferably have the same length as the corresponding sides of the vertical shield wires 1118 and 1120.

Figure 21:
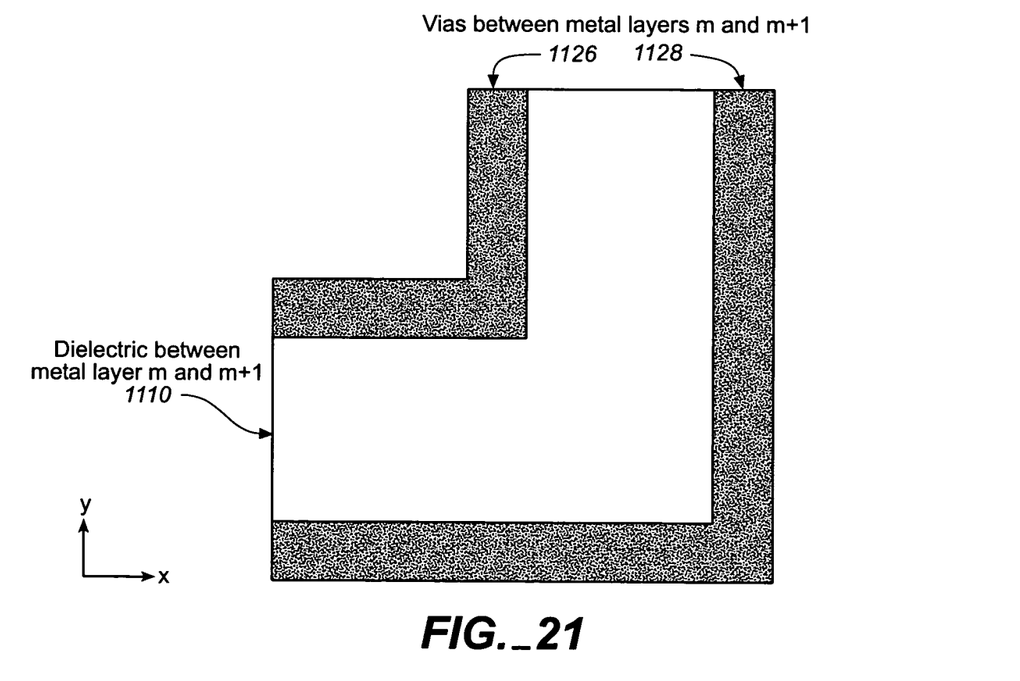
FIG. 21 illustrates a top view of the vias for the embodiment of FIG. 18.

FIG. 21 illustrates a top view of the vias 1126 and 1128 for the embodiment of FIG. 18. The vias 1126 and 1128 are formed in the dielectric layer 1110 according to well known techniques.

Figure 22:
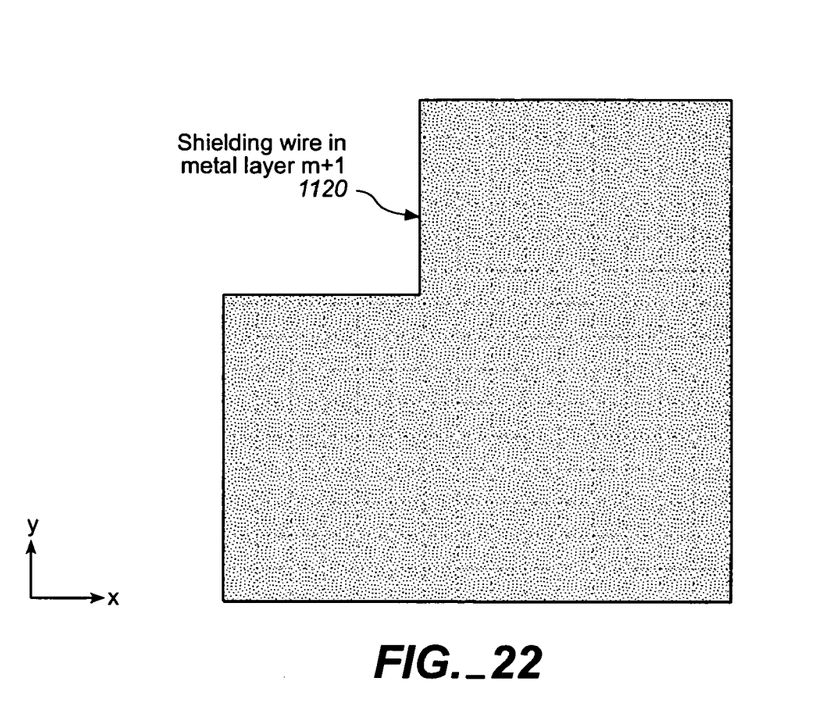
FIG. 22 illustrates a top view of the bottom vertical shield wire for the embodiment of FIG. 18.

FIG. 22 illustrates a top view of the bottom vertical shield wire 1120 for the embodiment of FIG. 18. The bottom vertical shield wire 1120 is formed as a wide trace in the metal layer 1106 according to well known techniques.

In another embodiment of the present invention, the coaxial crosstalk protection scheme of FIG. 11 is used for a signal wire that is routed from one metal layer to another.

Figure 23:
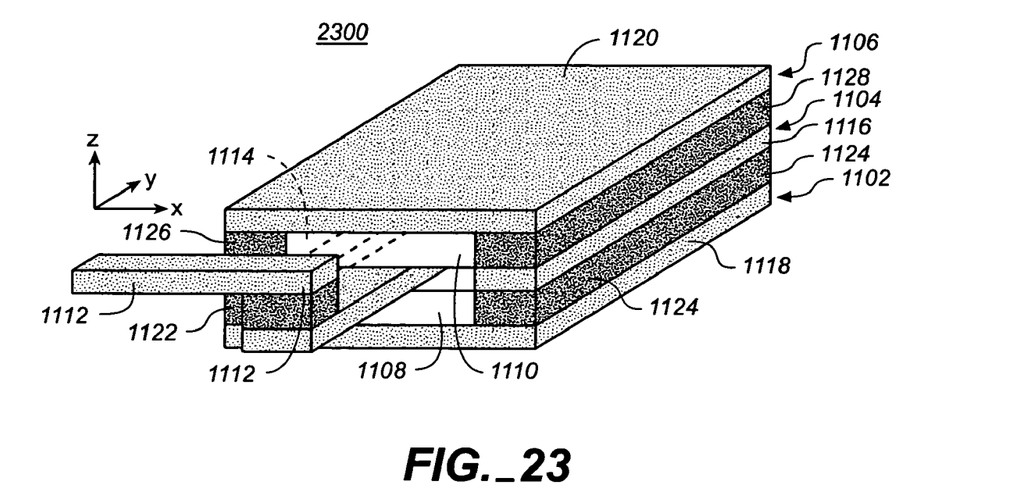
FIG. 23 illustrates a perspective view of a coaxial shield for a critical signal wire that is routed from one metal layer to another according to an embodiment of the present invention.

FIG. 23 illustrates a perspective view of a coaxial shield 2300 for a critical signal wire that is routed from one metal layer to another according to an embodiment of the present invention. Shown in FIG. 23 are metal layers 1102, 1104 and 1106, dielectric layers 1108 and 1110, a signal wire 1112, side shield wires 1114 and 1116, vertical shield wires 1118 and 1120, and vias 1122, 1124, 1126 and 1128.

In FIG. 23, the signal wire 1112 makes a right angle turn from the metal layer 1102 to the metal layer 1104, however, the signal wire may continue from one metal layer to the next without changing direction to practice various embodiments of the present invention within the scope of the appended claims.

In FIG. 23, the side shield wires 1114 and 1116, the vertical shield wires 1118 and 1120, and vias 1122, 1124, 1126 and 1128 form a coaxial shield around the portion of the signal wire 1112 that is routed in the intermediate metal layer 1104.

Figure 24:
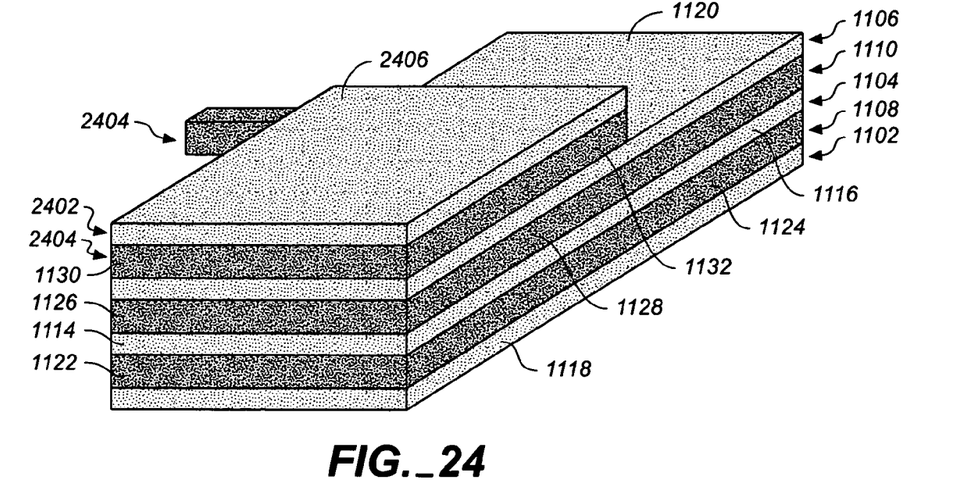
FIG. 24 illustrates an outside perspective view of the coaxial shield of FIG. 23.

FIG. 24 illustrates an outside perspective view of the coaxial shield of FIG. 23. Shown in FIG. 24 are metal layers 1102, 1104, 1106 and 2402, dielectric layers 1108, 1110 and 2404, side shield wires 1114 and 1116, vertical shield wires 1118, 1120 and 2406, and vias 1122, 1124, 1126, 1128, 2408 and 2410.

In FIG. 24, a coaxial shield formed by the vertical shield wire 2406 formed in the metal layer 2402, vias 2408 and 2410, and side shield wires formed in the metal layer 1106 is added around the portion of the signal wire 1112 that extends at a right angle in the metal layer 1106 from the metal layer 1104. The side shield wires formed in the metal layer 1106 follow the contour of the signal wire 1112 that extends at a right angle in the metal layer 1106 from the metal layer 1104.

Figure 25:
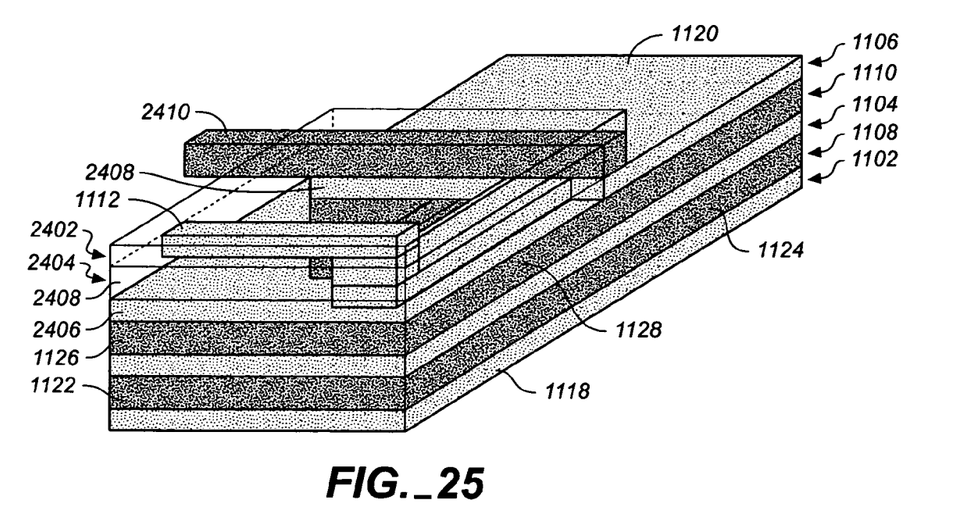
FIG. 25 illustrates a partially transparent perspective view of FIG. 24.

FIG. 25 illustrates a partially transparent perspective view of FIG. 24. Shown in FIG. 25 are metal layers 1102, 1104, 1106 and 2402, dielectric layers 1108, 1110 and 2404, a signal wire 1112, side shield wires 2406 and 2408, vertical shield wires 1118 and 1120, and vias 1122, 1124, 1126, 1128, 2408 and 2410.

In FIG. 25, a coaxial shield is added to the portion of the signal wire 1112 that is routed in the top metal layer 1110. The added coaxial shield includes the metal layer 2402, the dielectric layer 2404, the side shield wire 2406, and vias 2408 and 2410.

In another embodiment of the present invention, combined coplanar and vertical shielding may be used to encapsulate a module, for example, a hardmacro or a core, from the rest of the semiconductor chip.

Figure 26:
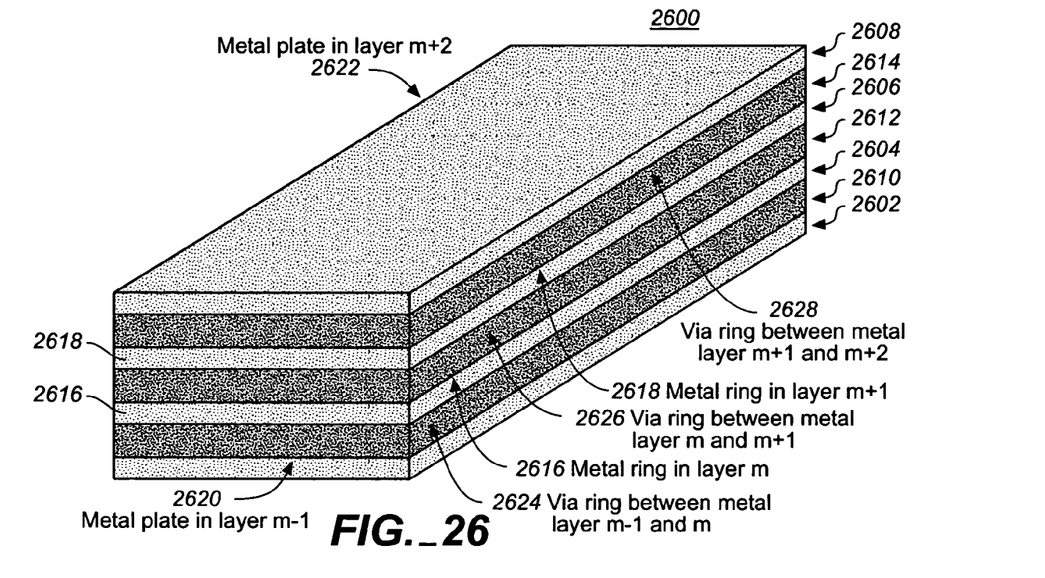
FIG. 26 illustrates a perspective view of a coaxial shield for encapsulating a module according to an embodiment of the present invention.

FIG. 26 illustrates a perspective view of a coaxial shield for encapsulating a module 2600 according to an embodiment of the present invention. Shown in FIG. 26 are metal layers 2602, 2604, 2606 and 2608, dielectric layers 2610, 2612 and 2614, side shield rings 2616 and 2618, vertical shield plates 2620 and 2622, and via rings 2624, 2626 and 2628.

In FIG. 26, the vertical shield plate 2620 is formed in the bottom metal layer 2602, and the vertical shield plate 2622 is formed in the top metal layer 2608 over the entire area of the module in the semiconductor die to be shielded.

The side shield rings 2616 and 2618 are formed as closed rings around the module in the intermediate metal layers, in this example, the two metal layers 2604 and 2606. Other numbers of metal layers and dielectric layers may also be used to practice various embodiments of the present invention within the scope of the appended claims.

The via rings 2624, 2626 and 2628 are formed in the dielectric layers 2610, 2612 and 2614 respectively to electrically connect the side shield rings 2616 and 2618 to the vertical shield plates 2620 and 2622.

In another embodiment of the present invention, the coaxial shield of FIG. 26 may be used to encapsulate a volume inside the semiconductor die.

Figure 27:
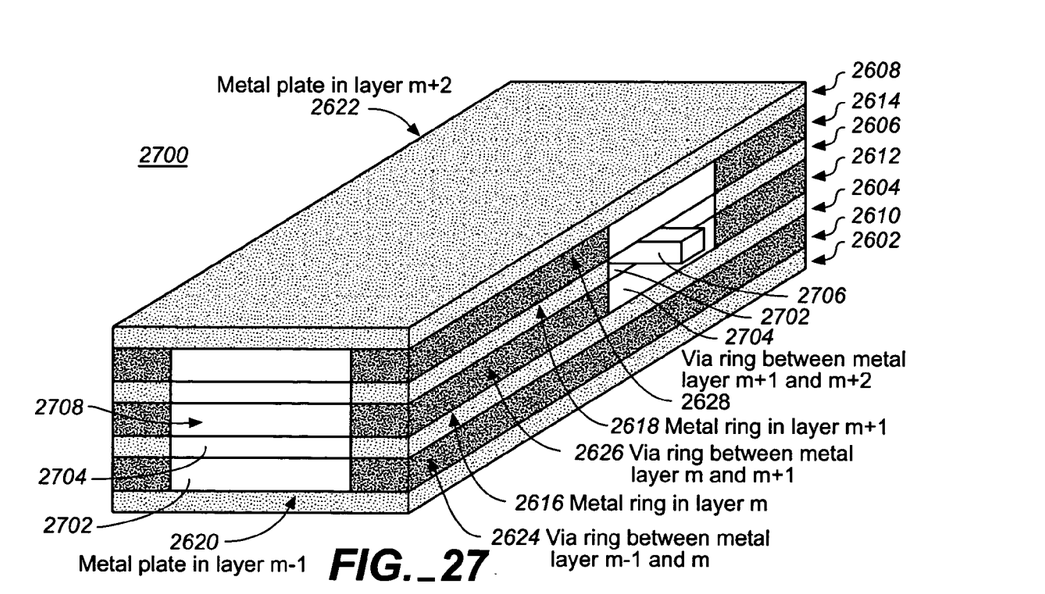
FIG. 27 illustrates a perspective view of the coaxial shield of FIG. 26 including openings in the via rings for conducting signals in and out of an encapsulated volume.

FIG. 27 illustrates a perspective view of the coaxial shield of FIG. 26 including openings in the via rings and metal layers for conducting signals in and out of an encapsulated volume. Shown in FIG. 27 are metal layers 2602, 2604, 2606 and 2608, dielectric layers 2610, 2612 and 2614, side shield rings 2616 and 2618, vertical shield plates 2620 and 2622, via rings 2624, 2626 and 2628, via openings 2702, side shield openings 2704, a signal wire 2706, and an encapsulated volume 2708.

The side shield rings 2616 and 2618 are formed in the same manner as the side shield wires described above, the vertical shield plates 2620 and 2622 may be formed in the same manner as the vertical shield wires described above, and the via rings 2624, 2626 and 2628 may be formed in the same manner as the vias described above with reference to the coaxial shield of FIG. 25.

In FIG. 27, the via openings 2702 are portions of the corresponding dielectric layers 2610, 2612 and 2614 that are not formed into vias. The side shield openings 2704 are portions of the corresponding metal layers 2604 and 2606 that are removed from the side shield rings 2616 and 2618. The via openings 2702, the side shield openings 2704, and the signal wire 2706 may be used, for example, to route signals in and out of the encapsulated volume 2708.

In another aspect of the present invention, A method of shielding a volume in a semiconductor chip includes steps of:
  forming a top vertical shield wire in a top metal layer of a semiconductor chip wherein the top vertical shield wire has a selected length for providing a coaxial shield;
  forming a first side shield wire in an intermediate metal layer of the semiconductor chip;
  forming a first upper via in a first dielectric layer of the semiconductor chip that extends lengthwise parallel to the first side shield wire to connect the first side shield wire to the top vertical shield wire along the selected length;
  forming a second side shield wire opposite the first shield wire in the intermediate metal layer of the semiconductor chip having a length corresponding to the selected length wherein the second side shield wire extends lengthwise parallel to the first side shield wire; and
  forming a second upper via in the first dielectric layer that extends lengthwise parallel to the second side shield wire to connect the second side shield wire to the top vertical shield wire along the length corresponding to the selected length.

Figure 28:
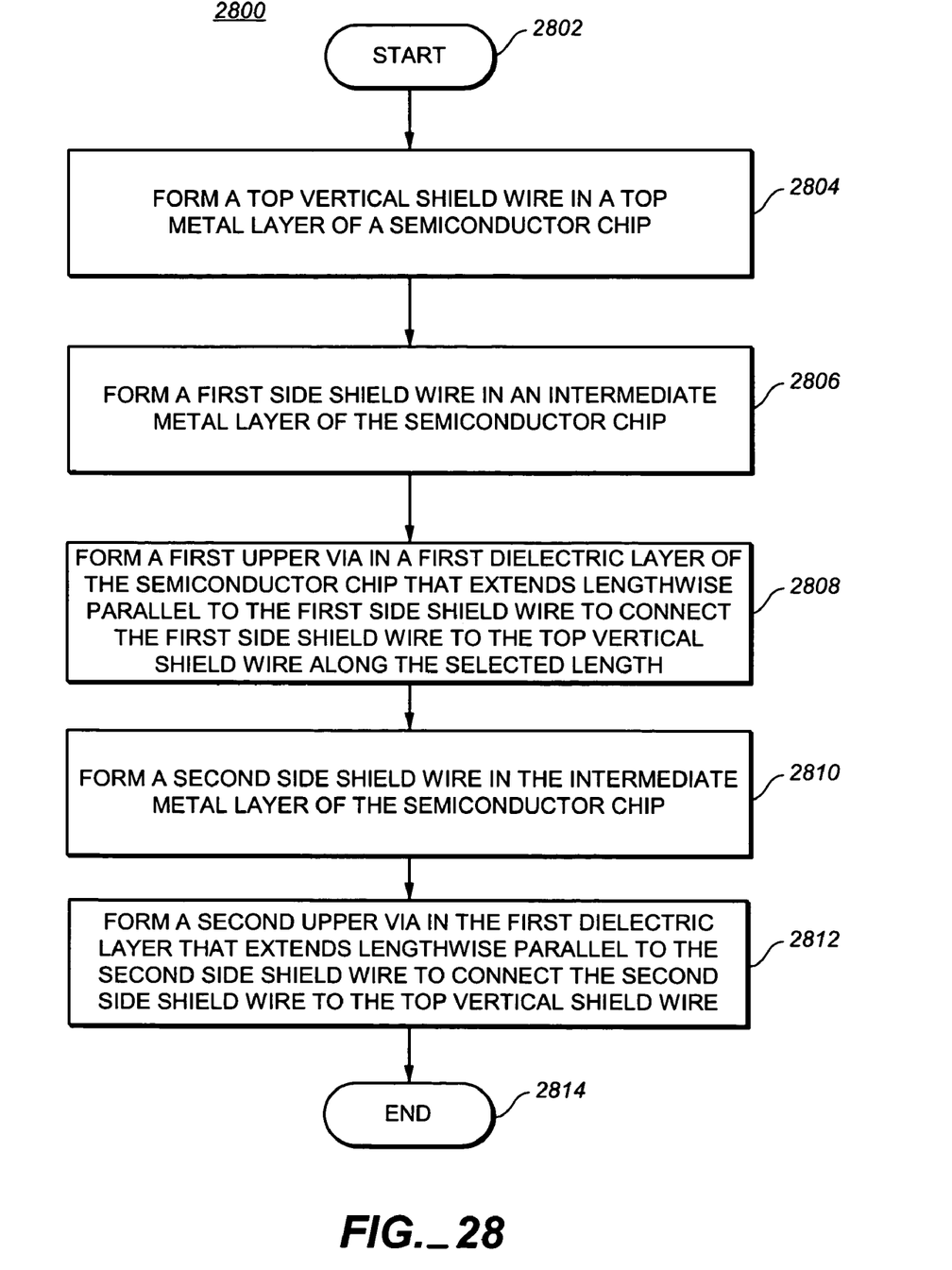
FIG. 28 illustrates a flow chart of a method of shielding a volume of an integrated circuit die according to an embodiment of the present invention.

FIG. 28 illustrates a flow chart of a method of shielding a volume of an integrated circuit die according to an embodiment of the present invention.

Step 2802 is the entry point of the flow chart 100.

In step 2804, a top vertical shield wire is formed in a top metal layer of a semiconductor chip.

In step 2806, a first side shield wire is formed in an intermediate metal layer of the semiconductor chip. The first side shield wire has a selected length, for example, the length of the signal wire to be shielded or the length of the volume of the semiconductor chip to be encapsulated.

In step 2808, a first upper via is formed in a first dielectric layer of the semiconductor chip that extends lengthwise parallel to the first side shield wire. The first upper via electrically connects the first side shield wire to the top vertical shield wire along the selected length.

In step 2810, a second side shield wire is formed opposite the first side shield wire in the intermediate metal layer of the semiconductor chip. The second side shield wire has a length corresponding to the selected length so that the second side shield wire extends lengthwise parallel to the first side shield wire.

In step 2812, a second upper via is formed in the first dielectric layer that extends lengthwise parallel to the second side shield wire. The second upper via electrically connects the second side shield wire to the top vertical shield wire along the length corresponding to the selected length.

Step 2814 is the exit point of the flow chart 100.

In other embodiments of the present invention, additional steps include forming a bottom vertical shield wire formed in a bottom metal layer of the semiconductor chip, forming a first lower via formed in a second dielectric layer of the semiconductor chip that extends lengthwise parallel to the first side shield wire to electrically connect the first side shield wire to the bottom vertical shield wire along the selected length, and forming a second lower via in the second dielectric layer that extends lengthwise parallel to the second side shield wire to electrically connect the second side shield wire to the bottom vertical shield wire along the length corresponding to the selected length.

Although the method of the present invention illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations could be made thereto by those skilled in the art without departing from the scope of the invention set forth in the following claims.

What is claimed is:

1. A coaxial shield for a semiconductor chip comprising:
  a top vertical shield wire formed in a top metal layer of a semiconductor chip wherein the top vertical shield wire has a selected length for providing a coaxial shield;
  a first side shield wire formed in an intermediate metal layer of the semiconductor chip;
  a first upper via formed in a first dielectric layer of the semiconductor chip that extends lengthwise parallel to the first side shield wire to electrically connect the first side shield wire to the top vertical shield wire along the selected length;
  a second side shield wire formed opposite the first side shield wire in the intermediate metal layer of the semiconductor chip having a length corresponding to the selected length wherein the second side shield wire extends lengthwise parallel to the first side shield wire; and
  a second upper via formed in the first dielectric layer that extends lengthwise parallel to the second side shield wire to electrically connect the second side shield wire to the top vertical shield wire along the length corresponding to the selected length.

2. The coaxial shield of claim 1 further comprising:
  a bottom vertical shield wire formed in a bottom metal layer of the semiconductor chip;
  a first lower via formed in a second dielectric layer of the semiconductor chip that extends lengthwise parallel to the first side shield wire to electrically connect the first side shield wire to the bottom vertical shield wire along the selected length; and a second lower via formed in the second dielectric layer that extends lengthwise parallel to the second side shield wire to electrically connect the second side shield wire to the bottom vertical shield wire along the length corresponding to the selected length.

3. The coaxial shield of claim 1 further comprising a signal wire formed in the intermediate metal layer between the first shield wire and the second shield wire.

4. The coaxial shield of claim 3 wherein the signal wire extends lengthwise parallel to the first shield wire along the selected length.

5. The coaxial shield of claim 1 further comprising:

a third side shield wire formed in an additional intermediate metal layer of the semiconductor chip wherein the third side shield wire extends lengthwise parallel to the first side shield wire along the selected length;

a first lower via formed in a second dielectric layer of the semiconductor chip that extends lengthwise parallel to the third side shield wire to electrically connect the third side shield wire to the first side shield wire along the selected length;

a fourth side shield wire formed in the additional intermediate metal layer of the semiconductor chip wherein the fourth side shield wire extends lengthwise parallel to the second side shield wire along the length corresponding to the selected length; and a second lower via formed in the second dielectric layer that extends lengthwise parallel to the second side shield wire to electrically connect the fourth side shield wire to the second side shield wire along the length corresponding to the selected length.

6. The coaxial shield of claim 5 further comprising:

a bottom vertical shield wire formed in a bottom metal layer of the semiconductor chip;

a third lower via formed in a third dielectric layer of the semiconductor chip that extends lengthwise parallel to the third side shield wire to electrically connect the third side shield wire to the bottom vertical shield wire along the selected length; and a fourth lower via formed in the third dielectric layer that extends lengthwise parallel to the fourth side shield wire to electrically connect the fourth side shield wire to the bottom vertical shield wire along the length corresponding to the selected length.

7. The coaxial shield of claim 5 further comprising a signal wire formed in the intermediate metal layer between the first shield wire and the second shield wire.

8. The coaxial shield of claim 7 wherein the signal wire extends lengthwise parallel to the first shield wire along the selected length.

9. A method of shielding a volume in a semiconductor chip comprising steps of:

forming a top vertical shield wire in a top metal layer of a semiconductor chip wherein the top vertical shield wire has a selected length for providing a coaxial shield;

forming a first side shield wire in an intermediate metal layer of the semiconductor chip;

forming a first upper via in a first dielectric layer of the semiconductor chip that extends lengthwise parallel to the first side shield wire to electrically connect the first side shield wire to the top vertical shield wire along the selected length;

forming a second side shield wire in the intermediate metal layer of the semiconductor chip having a length corresponding to the selected length wherein the second side shield wire extends lengthwise parallel to the first side shield wire; and forming a second upper via in the first dielectric layer that extends lengthwise parallel to the second side shield wire to electrically connect the second side shield wire to the top vertical shield wire along the length corresponding to the selected length.

10. The method of claim 9 further comprising steps of:

forming a bottom vertical shield wire in a bottom metal layer of the semiconductor chip;

forming a first lower via in a second dielectric layer of the semiconductor chip that extends lengthwise parallel to the first side shield wire to electrically connect the first side shield wire to the bottom vertical shield wire along the selected length; and forming a second lower via in the second dielectric layer that extends lengthwise parallel to the second side shield wire to electrically connect the second side shield wire to the bottom vertical shield wire along the length corresponding to the selected length.

11. The method of claim 9 further comprising a step of forming a signal wire in the intermediate metal layer between the first shield wire and the second shield wire.

12. The method of claim 11 wherein the signal wire extends lengthwise parallel to the first shield wire along the selected length.

13. The method of claim 9 further comprising a steps of:

forming a third side shield wire in an additional intermediate metal layer of the semiconductor chip wherein the third side shield wire extends lengthwise parallel to the first side shield wire along the selected length;

forming a first lower via in a second dielectric layer of the semiconductor chip that extends lengthwise parallel to the third side shield wire to electrically connect the third side shield wire to the first side shield wire along the selected length;

forming a fourth side shield wire in the additional intermediate metal layer of the semiconductor chip wherein the fourth side shield wire extends lengthwise parallel to the second side shield wire along the length corresponding to the selected length; and forming a second lower via in the second dielectric layer that extends lengthwise parallel to the second side shield wire to electrically connect the fourth side shield wire to the second side shield wire along the length corresponding to the selected length.

14. The method of claim 13 further comprising steps of:

forming a bottom vertical shield wire in a bottom metal layer of the semiconductor chip;

forming a third lower via in a third dielectric layer of the semiconductor chip that extends lengthwise parallel to the third side shield wire to electrically connect the third side shield wire to the bottom vertical shield wire along the selected length; and forming a fourth lower via in the third dielectric layer that extends lengthwise parallel to the fourth side shield wire to electrically connect the fourth side shield wire to the bottom vertical shield wire along the length corresponding to the selected length.

15. The method of claim 13 further comprising forming a signal wire in the intermediate metal layer between the first shield wire and the second shield wire.

16. The method of claim 15 wherein the signal wire extends lengthwise parallel to the first shield wire along the selected length.

* * * * *